(12) United States Patent
Sakai et al.

(10) Patent No.: US 9,040,817 B2
(45) Date of Patent: May 26, 2015

(54) ORGANIC THIN FILM SOLAR CELL

(75) Inventors: Jun Sakai, Osaka (JP); Kazuhiro Saito, Tsukuba (JP); Kunio Saito, legal representative, Tsukuba (JP); Namiko Saito, legal representative, Tsukuba (JP); Tetsuya Taima, Tsukuba (JP)

(73) Assignee: Panasonic Corporation, Osaka (JP)

( * ) Notice: Subject to any disclaimer, the term of this patent is extended or adjusted under 35 U.S.C. 154(b) by 1358 days.

(21) Appl. No.: 12/282,819

(22) PCT Filed: Mar. 14, 2007

(86) PCT No.: PCT/JP2007/055081
§ 371 (c)(1),
(2), (4) Date: Feb. 3, 2009

(87) PCT Pub. No.: WO2007/108385
PCT Pub. Date: Sep. 27, 2007

(65) Prior Publication Data
US 2010/0012189 A1 Jan. 21, 2010

(30) Foreign Application Priority Data
Mar. 20, 2006 (JP) ................................. 2006-077161

(51) Int. Cl.
*H01L 31/00* (2006.01)
*H01L 51/42* (2006.01)
(Continued)

(52) U.S. Cl.
CPC ............. *H01L 51/4246* (2013.01); *B82Y 10/00* (2013.01); *C08G 2261/1424* (2013.01);
(Continued)

(58) Field of Classification Search
CPC . H01L 51/055; H01L 51/0046; H01L 51/424; H01L 51/4246; H01L 51/0055; Y02E 10/549; B82Y 10/00
USPC ................................................ 136/263, 255
See application file for complete search history.

(56) References Cited

U.S. PATENT DOCUMENTS

2003/0127967 A1 7/2003 Tsutsui et al.
2005/0098726 A1 5/2005 Peumans et al.
(Continued)

FOREIGN PATENT DOCUMENTS

EP 0 482 920 A2 4/1992
JP 62-222668 A 9/1987
(Continued)

OTHER PUBLICATIONS

Maennig, "Organic p-i-n solar cells", Applied Physics A, Mar. 2004, vol. 79, pp. 1-14.*
International Search Report for the Application No. PCT/JP2007/055081 mailed Jun. 5, 2007.
Barnham, K. W. J. et al., "A New Approach to High-Efficiency Multi-Band-Gap Solar Cells", Journal of Applied Physics, Apr. 1, 1990, vol. 67, No. 7, pp. 3490-3493.
Sawatani, Takumi et al., "Organic EL Device with DCM/Alq$_3$ Quantum-Confined Structure", Technical Report of IEICE OME99-52 (Jul. 1999), pp. 1-6.
(Continued)

*Primary Examiner* — Devina Pillay
(74) *Attorney, Agent, or Firm* — McDermott Will & Emery LLP

(57) ABSTRACT

The present invention provides an organic thin film solar cell having a novel photoelectric conversion layer with superior conversion efficiency from light to electricity and superior carrier transportability to an electrode. The photoelectric conversion layer is arranged between a pair of electrodes at least one of which has optical transparency, and comprises a multilayer film formed by alternately laminating an electron-donating organic semiconductor thin film and an electron-accepting organic semiconductor thin film. The electron-donating organic semiconductor thin film is formed by organic semiconductor molecules in which cyclic compounds are bound in a linear fashion.

12 Claims, 5 Drawing Sheets

(51) Int. Cl.
*B82Y 10/00* (2011.01)
*H01L 51/00* (2006.01)

(52) U.S. Cl.
CPC ..... *C08G2261/3223* (2013.01); *H01L 51/0036* (2013.01); *H01L 51/0046* (2013.01); *H01L 51/0055* (2013.01); *H01L 51/0078* (2013.01); *H01L 51/4253* (2013.01); *H01L 2251/308* (2013.01); *Y02E 10/549* (2013.01)

(56) References Cited

U.S. PATENT DOCUMENTS

| | | | |
|---|---|---|---|
| 2005/0110007 A1* | 5/2005 | Forrest et al. | 257/40 |
| 2005/0136232 A1 | 6/2005 | Forrest et al. | |
| 2005/0156197 A1 | 7/2005 | Tsutsui et al. | |
| 2006/0027834 A1* | 2/2006 | Forrest et al. | 257/183 |
| 2006/0091797 A1 | 5/2006 | Tsutsui et al. | |
| 2006/0249202 A1* | 11/2006 | Yoo et al. | 136/263 |
| 2009/0045738 A1 | 2/2009 | Tsutsui et al. | |

FOREIGN PATENT DOCUMENTS

| | | |
|---|---|---|
| JP | 2003-298152 A | 10/2003 |
| JP | 2005-123208 A | 5/2005 |

OTHER PUBLICATIONS

Peumans, Peter et al., "Small Molecular Weight Organic Thin-Film Photodetectors and Solar Cells", Journal of Applied Physics, Apr. 1, 2003, vol. 93, No. 7, pp. 3693-3723.

Yoo, S. et al., "Efficient Thin-Film Organic Solar Cells Based on Pentacene/$C_{60}$ Heterojunctions", Applied Physics Letters, Nov. 29, 2004, vol. 85, No. 22, pp. 5427-5429.

Xue, Jiangeng et al., "Asymmetric Tandem Organic Photovoltaic Cells with Hybrid Planar-Mixed Molecular Heterojunctions", Applied Physics Letters, Dec. 6, 2004, vol. 85, No. 23, pp. 5757-5759.

Taima, Tetsuya et al., "Yuki Hakumaku Taiyo Denchi no Kenkyu Kaihatsu" ("Research and Development of Thin-Film Organic Solar Cell"), Kogyo Zairyo, Feb. 2007, vol. 55, No. 2, pp. 35-39.

Notice to Submit a Response for the Application No. 10-2008-7008064 from Korean Intellectual Property Office dated Mar. 3, 2010.

Supplementary European Search Report for the Application No. EP 07 73 8551 dated Jan. 17, 2011.

* cited by examiner

ORGANIC THIN FILM SOLAR CELL

TECHNICAL FIELD

The present invention relates to an organic thin film solar cell that uses an organic semiconductor.

BACKGROUND

Organic thin film solar cells are expected to be used as future low-cost solar cells since they can be produced easier and with lower equipment costs than conventional silicon and compound semiconductor solar cells.

In organic thin film solar cells of the p-n heterojunction type using p-type and n-type organic semiconductors, the organic semiconductors form excitons in which electron-hole pairs are strongly bound, and these diffuse and migrate to the interface of p-n junctions. Excitons are charge-separated into electrons and holes due the strong electric field at the interface, and the resulting electrons and holes are transported to respectively different electrodes resulting in the generation of electromotive force. However, in solar cells employing this configuration, since the diffusion length of the excitons is short at roughly only several tens of nanometers, carrier paths are actually able to be effectively formed only within a distance range of several tens of nanometers from the p-n junction interfaces, thus resulting in an extremely low conversion efficiency.

As a result of subsequent progress in the area of bulk heterojunction technology, enabling p-type organic semiconductors (donors) and n-type organic semiconductors (acceptors) to be combined so that p-n junctions can be dispersed within a thin film at the nanometer level, the conversion efficiency of organic thin film solar cells improved considerably. For example, J. Xue, S. Uchida, B. P. Land and S. R. Forrest et al. describe an organic thin film solar cell having a bulk heterojunction configuration as shown in FIG. 9 (Appl. Phys. Lett., 85, p. 5757 (2004)). A photoelectric conversion layer 3 of this solar cell has a bulk heterojunction structure combining a p-type organic semiconductor 15 and an n-type organic semiconductor 16 that is dispersed at the nanometer level and arranged between a transparent electrode 1 and a metal electrode 2. This type of layer configuration is formed by laminating on the surface of a transparent substrate 12.

A vapor deposition method using a low molecular weight material or a coating method using a high molecular weight material is primarily used to form the photoelectric conversion layer 3. Vapor deposition consists of simultaneously vapor-depositing (co-depositing) two types of materials consisting of a p-type organic semiconductor and n-type organic semiconductor, and is characterized by allowing the formation of a layer by layering multiple thin films having respectively different functions in the manner of the bulk heterojunction structure of FIG. 9. On the other hand, coating consists of applying a soluble donor material (p-type organic semiconductor) or acceptor material (n-type organic semiconductor) by dissolving in a solvent, and is characterized by facilitating uniform dispersion of the p-n junction interface to a greater extent than vapor deposition.

In an organic thin film solar cell employing this structure, an exciton E generated as a result of photoabsorption immediately reaches a p-n interface by diffusion and migration at the nanometer level, charge separation occurs, and electron e is transported to electrode 2 through a carrier path coincidentally connected to an n-type organic semiconductor 16, while a hole h is transported to an electrode 1 on the opposite side through a carrier path a p-type organic semiconductor 15, resulting in the generation of electromotive force. In addition, as a result of photoelectric conversion layer 3 being interposed between a p-type organic semiconductor layer 17 and an n-type organic semiconductor layer 18, carriers generated in photoelectric conversion layer 3 can be efficiently collected by an internal interface formed by the two layers of p-type organic semiconductor layer 17 and n-type organic semiconductor layer 18. Since photoelectric conversion layer 3 plays a neutral role, this structure is also referred to as a pin type. In addition, as a result of inserting a hole transport layer 10 and an electron transport layer 11, selective transport of the carrier, reduction of recombination and further improvement of efficiency can be achieved.

In this manner, the problem of a short exciton diffusion distance can be resolved by forming a photoelectric conversion layer comprising a bulk heterojunction structure combining a p-type organic semiconductor and n-type organic semiconductor.

On the other hand, another important issue is the extent to which the charge-separated carriers are transported to the electrodes without being deactivated (recombined). In a solar cell, work is carried out by repeating a cycle in which generated electrons are allowed to flow to the outside or return to the solar cell and recombine with holes. In other words, in the case there is imbalance in the numbers of electrons and holes collected, the actual amount of work is limited by that having the smaller number of carriers. Here, mobility ($\mu$) is used as a parameter indicating transportability. This indicates drift velocity in the presence of a given electric field, and in the case of defining carrier life as $\tau$ and field strength as E, the distance over which a carrier is transported is represented by $\mu\tau$E. Thus, a material having a high mobility has a lower probability of recombination and is able to transport a carrier over a longer distance.

Although low molecular weight organic solar cells using fullerene for the n-type organic semiconductor are known to demonstrate high conversion efficiency, since the electron transport capacity of fullerene exceeds the hole transport capacity of p-type organic semiconductors, an excess of electrons end up being transported resulting in the hole transport capacity limiting the overall generated current. In addition, in low molecular weight organic solar cells primarily using metal phthalocyanine for the p-type organic semiconductor, although metal phthalocyanine is superior in terms of optical absorption and dispersibility with fullerene, due to its low mobility, the number of holes that reach the electrode by being transported through phthalocyanine is lower than the number of electrons that reach the electrode by being transported through fullerene. Consequently, phthalocyanine ends up limiting the generated current resulting in the problem of decreased conversion efficiency.

In recent years, however, various high-mobility materials have been developed during the course of development of organic transistors. For example, oligothiophene and pentacene are typical examples of materials used as p-type organic semiconductors, and allow the obtaining of mobility of about 1 $cm^2$/Vs. Although attempts have been made to apply these materials to organic thin film solar cells, operation has of yet only been confirmed for those of a type in which a p-type organic semiconductor layer and n-type organic semiconductor layer are stacked together to form a p-n junction. In solar cells of this type, since the only region in which the carrier can be effectively extracted is the vicinity of flat p-n junctions, in order to enable these solar cells to operate as organic thin film solar cells having high conversion efficiency, it is necessary to form a bulk heterojunction structure as shown in FIG. 9, in which a p-type organic semiconductor and n-type organic semiconductor are combined by co-deposition, and disperse the surfaces of the p-n junctions within a photoelectric conversion layer. However, since oligothiophene and pentacene are molecules in which cyclic compounds are bound in a linear fashion, they easily aggregate on the surface of a substrate during vapor deposition, thereby making it difficult to uniformly disperse molecules of the p-type organic semiconductor in molecules of the n-type organic semiconductor at the nanometer level, and resulting in the problem of it being difficult to effectively improve conversion efficiency.

DISCLOSURE OF THE INVENTION

With the foregoing in view, an object of the present invention is to provide an organic thin film solar cell having high conversion efficiency of light to electricity in the same manner as a photoelectric conversion layer of a bulk heterojunction structure, while also having the photoelectric conversion layer of a novel structure that demonstrates superior carrier transportability to an electrode.

Namely, an organic thin film solar cell as claimed in the present invention comprises a pair of electrodes and a photoelectric conversion layer. At least one of a pair of the electrodes has optical transparency. The photoelectric conversion layer is arranged between the electrodes. The feature of the invention resides in that the photoelectric conversion layer comprises a multilayer film. The multilayer film is formed by an electron-donating organic semiconductor thin film and an electron-accepting thin film which are alternately stacked. The electron-donating organic semiconductor thin film is composed of organic semiconductor molecules in which cyclic compounds are bound in a linear fashion.

In the present invention, since the organic semiconductor molecules in which cyclic compounds are bound in a linear fashion lacks dispersibility with organic semiconductor molecules of fullerene and the like, the alternating stack thereof to form the multilayer film enables operation similar to that of the photoelectric conversion layer having a bulk heterojunction structure. In addition, carrier transportability can be improved due to the high mobility characteristics of the organic semiconductor molecules in which cyclic compounds are bound in a linear fashion.

It is preferred that the electron-donating organic semiconductor thin film and the electron-accepting thin film preferably each have a film thickness of 10 nm or less. In addition, in this case, it is more preferred that the multilayer film is interposed between an electron-donating organic semiconductor thin film having a film thickness of 10 nm or more and an electron-accepting thin film having a film thickness of 10 nm or more.

The organic semiconductor molecules are preferably an acene-based molecule compound represented by the following formula (1):

$$C_{6+4(n-1)}H_{6+2(n-1)} \tag{1}$$

(wherein n represents an integer of 2 or more).

The electron-accepting thin film preferably comprises fullerene or a fullerene compound.

In addition, the film thickness of the electron-donating organic semiconductor thin film is preferably greater than the film thickness of the electron-accepting thin film.

It is required to enhance the conversion efficiency of the solar cell. So, it is preferred that the multilayer film further comprises an intermediate layer which is provided between the electron-donating organic semiconductor thin film and the electron-accepting thin film. The intermediate layer is preferably an electron donating organic semiconductor thin film having a band gap smaller than the adjacent electron-donating organic semiconductor thin film. Or, the intermediate layer is preferably an electron-accepting organic semiconductor thin film having a band gap smaller than the adjacent electron accepting thin film.

Further characteristics of the present invention and effects resulting there from can be better understood based on the best mode for carrying out the invention and examples thereof described below.

BRIEF DESCRIPTION OF THE DRAWINGS

FIG. 2A is an enlarged cross-sectional view of a photoelectric conversion section, while FIG. 2B is a drawing showing the energy band structure thereof;

FIG. 6A is enlarged cross-sectional view of the photoelectric conversion section in FIG. 5, while FIG. 6B is a drawing showing the energy band structure thereof;

BEST MODE FOR CARRYING OUT THE INVENTION

Following provides a detailed explanation of an organic thin film solar cell of the present invention based on preferred embodiments thereof.

Figure 1:
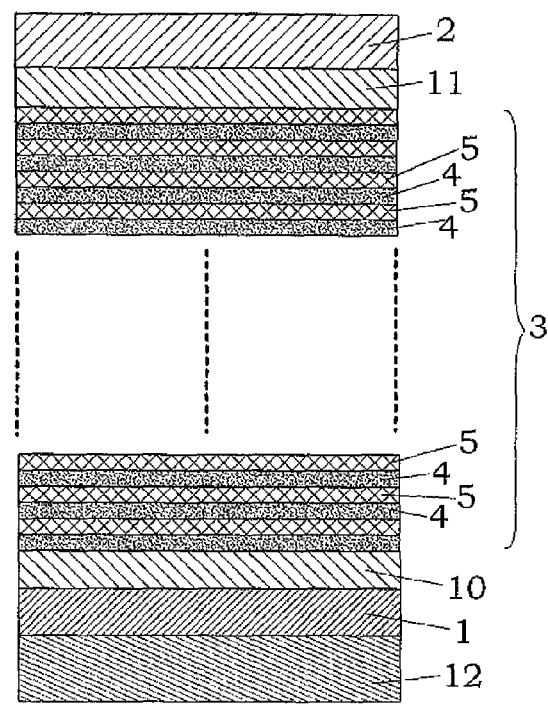
FIG. 1 is a schematic cross-sectional view of an organic thin film solar cell as claimed in a preferred embodiment of the present invention.

An example of the organic thin film solar cell of the present invention is shown in FIG. 1. This solar cell has an electrode 1, a hole transport layer 10, a photoelectric conversion layer 3, an electron transport layer 11, an electrode 2, and a transparent substrate 12. The electrode 1, the hole transport layer 10, the photoelectric conversion layer 3, the electron transport layer 11, and the electrode 2 are sequentially stacked on the transparent substrate 12. The electrode 1 is located on the side of transparent substrate 12. The electrode 1 is a transparent electrode having an optical transparency. On the other hand, the electrode 2 is a metal electrode. The photoelectric conversion layer 3 is formed by a multilayer film. The multilayer film is formed by an electron-donating organic semiconductor thin film 4 and an electron-accepting thin film 5 which are alternately stacked.

In the present invention, an electron-donating organic semiconductor thin film 4 is formed by p-type organic semiconductor molecules in which cyclic compounds are bound in a linear fashion. Here, examples of cyclic compounds include compounds having a benzene ring or thiophene ring, and an acene-based molecule compound represented by formula (1) can be used for the p-type organic semiconductor molecules in which benzene rings are bound in a linear fashion. In formula (1), n represents an integer of 2 or more, and although there are no particular limitations on the upper limit of n, n is preferably 6 or less in terms of practicality. Examples of this acene-based molecule compound include tetracene, in which four benzene rings are coupled uniaxially as indicated by formula (2), and pentacene, in which five benzene rings are coupled as indicated by formula (3). In addition, oligothiophene, in which thiophene rings are coupled uniaxially within a range of 4 to 12 rings, can be used as p-type organic semiconductor molecules in which thiophene rings are coupled in a linear fashion, an example of which is sexithiophene, in which six thiophene rings are coupled as shown in formula (4). Since these linear molecules have a large molecular cohesive energy, they have the characteristic of being able to form a highly crystalline thin film on a substrate by vapor deposition even at room temperature.

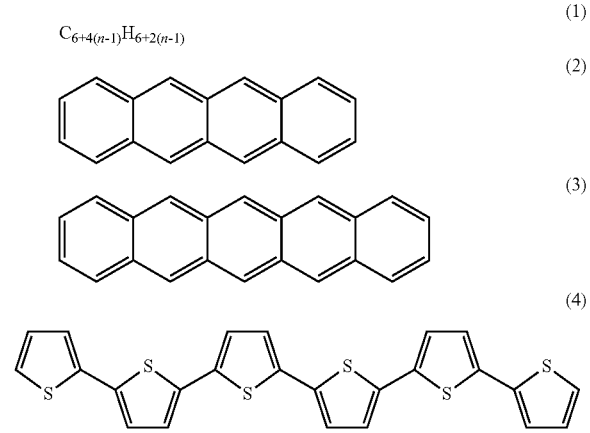

$$C_{6+4(n-1)}H_{6+2(n-1)} \quad (1)$$

(2)

(3)

(4)

Electron-accepting thin film 5 can be formed from n-type organic semiconductor molecules. Fullerene or a fullerene compound can be used for the n-type organic semiconductor molecules. Fullerene exists as C60, C70 or C82 and the like depending on the number of carbon atoms thereof, while a fullerene compound refers to a compound in which substituents are bound to carbon atoms of C60, C70 or other forms of fullerene. Hereinafter, fullerene and fullerene compounds will be collectively referred to as fullerene.

Here, the mobilities of organic semiconductor materials using FET have been investigated during the development of organic transistors, and in contrast to the mobility of phthalocyanine being 0.02 to 0.03 $cm^2/Vs$, the mobilities of oligothiophene and pentacene exhibit larger values of 0.1 to 1 $cm^2/Vs$ and 1 $cm^2V/s$, respectively.

Figure 3:
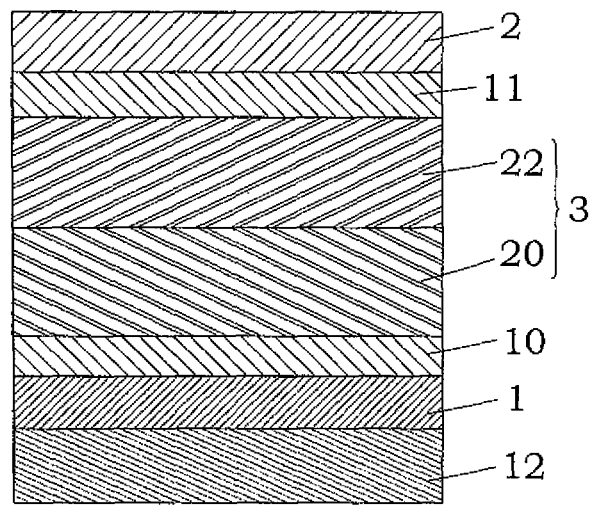
FIG. 3 is a schematic cross-sectional view of an organic thin film solar cell provided with a photoelectric conversion layer composed of pentacene and fullerene heterojunction.
Figure 9:
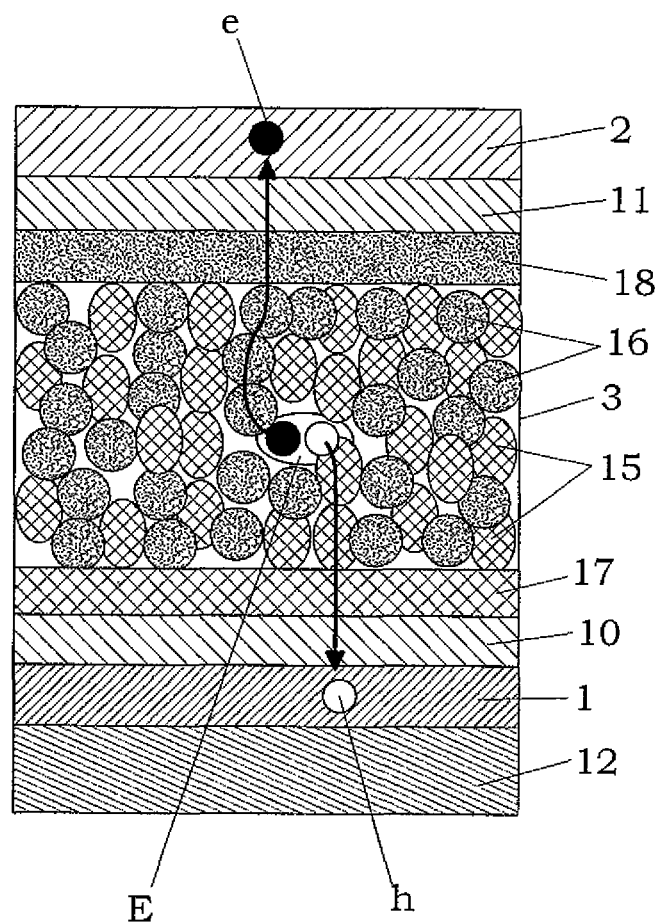

A p-n junction type of organic thin film solar cell using pentacene for the p-type organic semiconductor and fullerene for the n-type organic semiconductor has been proposed by, for example, S. Yoo, B. Domercq and B. Kippelem, et al. (Applied Physics Letters, Vol. 85, No. 22, 29 November, p. 5427 (2004)). In this solar cell, although the heterojunction of pentacene and fullerene demonstrates favorable diode characteristics, this is not a bulk heterojunction type of solar cell. In addition, when the inventors of the present invention fabricated an organic thin film solar cell in which photoelectric conversion layer 3 was formed by forming a heterojunction between a pentacene layer 20 and a fullerene (C60) layer 22 as shown in FIG. 3, favorable diode characteristics were confirmed to be demonstrated. Moreover, when this pentacene/fullerene heterojunction diode was irradiated with simulated sunlight at an AM of 1.5 G and 100 $MW/cm^2$ using a solar simulator to investigate conversion efficiency, a maximum efficiency of 0.9% was demonstrated. Thus, if a bulk heterojunction structure, in which p-n junction interfaces as shown in FIG. 9 were dispersed through the entire film of the photoelectric conversion layer, was able to be realized in this pentacene/fullerene system as well, then it would be possible to enhance the charge separation efficiency of excitons generated throughout the entire photoelectric conversion layer, while the use of pentacene having superior hole transport mobility can be expected to further improve conversion efficiency.

Therefore, although the fabrication of a photoelectric conversion layer combining pentacene and fullerene was considered by applying a conventional deposition method in the form of vapor deposition, it is extremely difficult to uniformly disperse these materials for the reasons indicated below. For example, in the case of forming a photoelectric conversion layer having a bulk heterojunction structure as shown in FIG. 9, a photoelectric conversion layer can be formed in which phthalocyanine and fullerene are dispersed at the nanometer level by simultaneous vapor deposition (co-deposition) of phthalocyanine and fullerene, and a hole-electron carrier path can be formed to allow the obtaining of high characteristics. However, in the case of forming a thin film by simultaneously vapor-depositing pentacene and fullerene, since the pentacene consists of linear molecules, the pentacene orients and aggregates easily (aggregating in the planar direction on the order of hundreds of nanometers), thereby resulting in the formation of an extremely non-uniform thin film. Consequently, pentacene cannot be dispersed with fullerene at the nanometer level. Thus, even if an organic thin film solar cell having the structure shown in FIG. 9 is formed using pentacene and fullerene, the resulting solar cell is only able to demonstrate extremely low characteristics on the order of a conversion efficiency of about 0.03%.

Although the above description provided an explanation of the case of using pentacene for the p-type organic semiconductor molecules, since other acene-based compounds and oligothiophenes are also linear molecules in which cyclic compounds are bound in a linear fashion, they too orient and aggregate easily in the same manner, thereby making it difficult to disperse n-type organic semiconductor molecules such as fullerene at the nanometer level. In this manner, it can be said to be difficult to form a photoelectric conversion layer having a bulk heterojunction structure by conventional co-deposition using p-type organic semiconductor molecules in which cyclic compounds are coupled in a linear fashion.

Therefore, as shown in FIG. 1, the present invention forms photoelectric conversion layer 3 in the form of a multilayer film comprising the alternating lamination of two or more layers each of electron-donating organic semiconductor thin film 4, formed with p-type organic semiconductor molecules, and electron-accepting thin film 5, formed with n-type organic semiconductor molecules. Thin film 4 and thin film 5 are respectively formed at an ultra-thin film thickness of 10 nm or less, and this is referred to as a superlattice structure in semiconductor technical fields. Although thin film 4 and thin film 5 are the thinner the better, the molecular size of 1 nm is the lower limit of film thickness. Since a uniform film cannot be obtained at thicknesses less than this, the operation required by the present invention can no longer be obtained. In addition, although there are no particular limitations on the number of layers of thin film 4 and thin film 5, the number of thin films 4 and thin films 5 is preferably within the range of 2 to 50 layers each.

Figure 2:
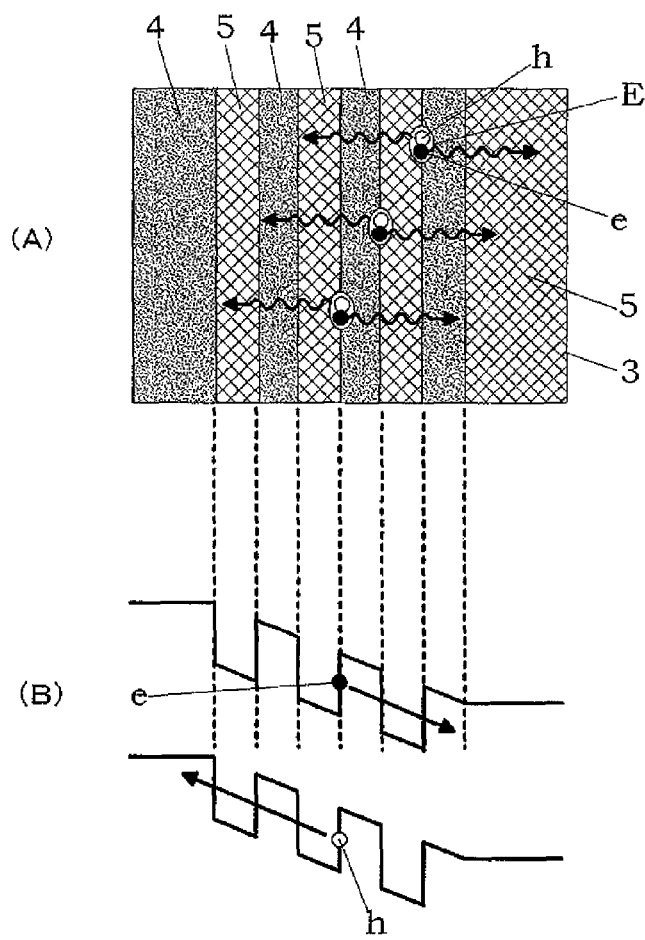

The mechanism of electrical power generation of photoelectric conversion layer 3 formed by alternately laminating p-type organic semiconductor thin film 4 and n-type organic semiconductor thin film 5 is shown in FIGS. 2A and 2B. First, when light enters, excitons E, consisting of pairs of electrons e and holes h, are generated in p-type organic semiconductor thin film 4 or n-type organic semiconductor thin film 5. Although excitons E diffuse and move to randomly formed p-n junction interfaces and undergo charge separation in the structure of photoelectric conversion layer 3 shown in FIG. 9, in the case p-type and n-type thin layers 4 and 5 are alternately stacked as shown in FIG. 2A, excitons E diffuse and move to regularly and mutually differently formed p-n junction interfaces where they undergo charge separation. Although the probability of recombination occurring until an exciton reaches a p-n junction interface increases if the movement distance to an interface becomes long since the probability of the presence of a p-n junction interface in a certain unit volume varies in the case of p-type organic semiconductors and n-type organic semiconductors being randomly distributed as in the photoelectric conversion layer 3 of FIG. 9, in a structure in which p-type organic semiconductor thin layer 4 and n-type organic semiconductor thin layer 5 are alternately stacked as in FIG. 2A, since p-n junction interfaces are made to be present at a cycle at the nanometer level that has been set in advance, all excitons E reliably reach a p-n junction interface, thereby making it possible for nearly 100% of the excitons to achieve charge separation.

On the other hand, electrons e and holes h generated by charge separation in this manner must be transported to electrodes 1 and 2. Although they are transported to electrodes by following carrier paths coincidentally leading thereto in the case of photoelectric conversion layer 3 having the bulk heterojunction structure of FIG. 9, since the carrier paths are formed randomly, although electrons e and holes h reach an electrode in the case of carrier paths leading to electrodes 1 and 2, while in the case a carrier path is interrupted at an intermediate location in the path, the holes h are deactivated at that point and are not transported to an electrode. In contrast, in the case of the structure of FIG. 2A of the present invention, there are no carrier paths and carriers are forced to travel in a direction perpendicular to the stacked film consisting of thin films 4 and 5. The energy bands at this time are shown in FIG. 2B. Although each p-n junction has a potential barrier and carriers have to overcome this barrier, since the film thickness of each thin film 4 and 5 is 10 nm or less, as indicated by the arrow in FIG. 2B, electron e is able to penetrate this barrier due to tunnel effects. Thus, as a result of forming photoelectric conversion layer 3 with ultra-thin thin films 4 and 5 as in the present invention, electrons e and holes h formed by charge separation can be reliably transported to electrodes 1 and 2.

Here, an explanation of a superlattice structure is provided. A superlattice structure, which uses epitaxial growth of a compound semiconductor, was invented in the 1970's, and various devices were developed by applying this technology since it enables band gap, optical properties, carrier mobility and the like to be controlled by repeatedly and alternately laminating different types of thin films. In an application to compound semiconductor solar cells, for example, Barnham and Duggan et al. used a superlattice structure for the i layer of a pin-type solar cell (J. Appl. Phys., 67, 7, p. 3490, 1990). In this solar cell, the band gap of the i layer is controlled with the material and film thickness used in the superlattice by controlling the voltage in the p and n layers. Although this is the same as the superlattice structure of the present invention in terms of using tunnel effects in the carrier transport after charge separation, but differs from the present invention in that an alternating stacked structure is utilized for improving the efficiency of charge separation in the present invention. In addition to employing a compound semiconductor, in the case of an inorganic semiconductor solar cell, since electron and hole pairs formed by optical energy have weak binding force and are promptly separated by thermal energy and the like resulting in their transport in the form of free carriers, this type of solar cell does not exhibit the effects of a superlattice structure with respect to charge separation.

In addition, an example of the application of a superlattice structure to an organic semiconductor device is the application of a superlattice structure to an organic EL device by Sawa, Ohmori and Yoshino, et al. (Technical Report of the Institute of Electronics, Information and Communication Engineers, Vol. 7, OME99-52, p. 1, 1999). This report proposes a structure in which organic semiconductors having two different types of energy band structures are alternately stacked, and an improvement of photoemission effects is achieved due to the effect of entrapping carriers that have been injected from the outside. However, the manner in which the superlattice structure is used differs from the operation of a solar cell as in the present invention.

Moreover, P. Peumans, A. Yakimov and S. R. Forrest et al. used a superlattice structure in a photodiode comprised of an organic semiconductor (Jour. of Appl. Phys., Vol. 93, No. 7, p. 3693, 2003). Here, copper phthalocyanine is used for the p-type organic semiconductor, PTCBI (3,4,9,10-perylenetetracarboxylic bis-benzimidazole) is used for the n-type organic semiconductor, and these are alternately stacked to investigate the relationship between film thickness and diode characteristics. The relationship is indicated between film thickness of an alternating layer film and external quantum efficiency when a reverse bias is applied to this device, and during zero bias required for operation as a solar cell, quantum efficiency is 0.1 or less when the number of layers is large, and carrier transport is not carried out even if charge separation occurs in the case of this combination of n-type material and p-type material. In this manner, the manner in which the superlattice structure is used differs from the operation of a solar cell of the present invention.

In addition, in the case of a bulk heterojunction type of organic thin film solar cell using phthalocyanine for the p-type organic semiconductor molecules, although it is possible to obtain a photoelectric conversion layer that is extremely uniformly dispersed at the nanometer level by co-deposition, bulk heterojunction effects conversely cannot be expected in the case of a superlattice structure in which thin films are alternately stacked as in the photoelectric conversion layer of the present invention. This is thought to be because, since phthalocyanine has a flat molecular structure and low carrier mobility, in an ultra-thin film in the form of a layer on the order of several molecules thick, the film density is uniform in the planar direction, and recombination occurs easily when the carrier overcomes the potential barrier.

On the other hand, in the case of forming a superlattice structure with p-type organic semiconductor molecules, in which cyclic compounds are bound in a linear fashion in the manner of pentacene, and n-type organic semiconductor molecules such as fullerene as in the present invention, since the linear molecules in which cyclic compounds are bound in a linear fashion aggregate and orient easily during vapor deposition, they are able to easily orient and form an ultra-thin film regardless of the substrate on which they are vapor-deposited. In addition, since combining such materials realizes improvement of charge separation efficiency, the formation of well-defined p-n junction interfaces, and high mobility of the p-type organic semiconductor material, an organic thin film solar cell can be obtained having high carrier transportability in the superlattice structure and high conversion efficiency.

Furthermore, in the formation of photoelectric conversion layer 3 by the p-type organic semiconductor thin film 4 and n-type organic semiconductor thin film are alternately stacked, it is possible to form the p-type organic semiconductor thin film 4 and n-type organic semiconductor thin film 5 may be formed to the same film thicknesses. However, it is preferred that the film thickness of the p-type organic semiconductor thin film 4 is greater than that of n-type organic semiconductor thin film 5. In this configuration, it is possible to further improve solar cell characteristics. This is thought to be because, since the organic semiconductor molecules such as pentacene or oligothiophene, in which cyclic compounds are bound in a linear fashion, that form p-type organic semiconductor thin film 4 exhibit greater photoabsorption and higher mobility than fullerene and the like used to form n-type organic semiconductor thin film 5, both photoabsorption and carrier transportability can be improved. In the case of forming the film thickness of p-type organic semiconductor thin film 4 to be greater than the film thickness of n-type organic semiconductor thin film 5 in this manner, although there are no particular limitations thereon, the film thickness of p-type organic semiconductor thin film 4 is preferably, for example, within the range of 4 times or less the film thickness of n-type organic semiconductor thin film 5.

Figure 4:
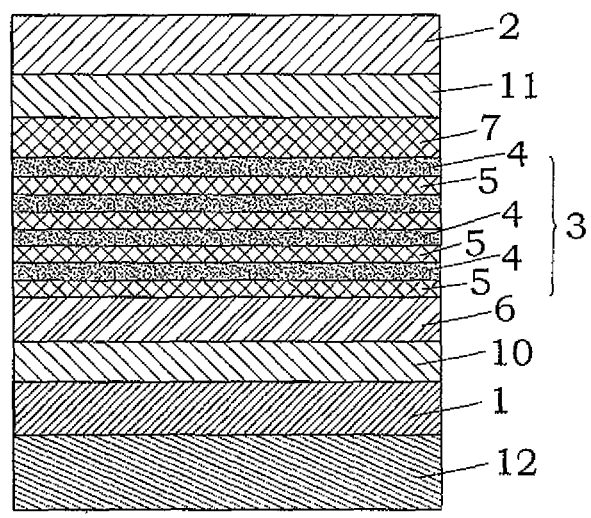
FIG. 4 is a schematic cross-sectional view of an organic thin film solar cell as claimed in another preferred embodiment of the present invention.

Another embodiment of the present invention is shown in FIG. 4. In this solar cell, photoelectric conversion layer 3 is interposed between an electron-donating organic semiconductor thin film 6 and an electron-accepting thin film 7. The photoelectric conversion layer 3 is formed by the p-type organic semiconductor thin film 4 and n-type organic semiconductor thin film 5 which are alternately stacked. The electron-donating organic semiconductor thin film 6 of p-type has a film thickness of 10 nm or more. The electron-accepting thin film 7 of n-type has a film thickness of 10 nm or more. The electron-donating organic semiconductor thin film 6, the electron accepting thin film 7, and the photoelectric conversion layer 3 forms a pin type solar cell. The p-type organic semiconductor thin film 6 is arranged between photoelectric conversion layer 3 and hole transport layer 10, while the n-type organic semiconductor thin film 7 is arranged between photoelectric conversion layer 3 and electron transport layer 11, and the remainder of the configuration is the same as shown in FIG. 1. Although there are no particular limitations on the upper limits of the film thicknesses of p-type organic semiconductor thin film 6 and n-type organic semiconductor thin film 7, in terms of practicality, the upper limit is about 100 nm.

In this case, since an internal electric field is generated between p-type organic semiconductor thin film 6 and n-type organic semiconductor thin film 7, and this is able to improve carrier transport efficiency, it is possible to further improve conversion efficiency. Although it is possible to demonstrate the same action by an internal electric field provided the internal electric field is generated due to a difference in work functions between optically transparent electrode 1 and metal electrode 2 even p-type organic semiconductor thin film 6 and n-type organic semiconductor thin film 7 are not present, in the case of a pin type as described above, the effects of excitons generated in p-type organic semiconductor thin film 6 and n-type organic semiconductor thin film 7 and excitons generated near junction interfaces can be utilized, thereby acting as transport layers of both carriers, demonstrating effects that improve voltage and form factors and making it possible to further enhance conversion efficiency.

Figure 5:
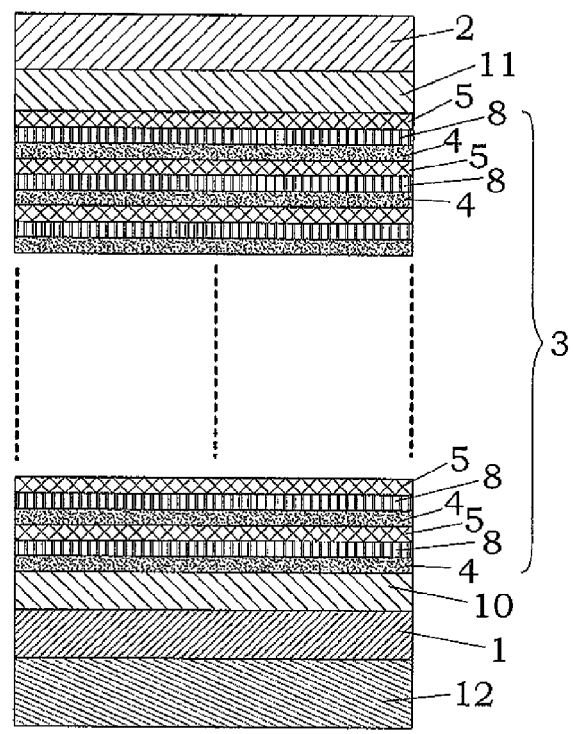
FIG. 5 is a schematic cross-sectional view of an organic thin film solar cell as claimed in still another preferred embodiment of the present invention.

Still another embodiment of the present invention is shown in FIG. 5. Both generated current and generated voltage must be improved to further improve conversion efficiency. The solar cell shown in FIG. 5 is characterized by having photoelectric conversion layer 3, and an intermediate layer 8. The photoelectric conversion layer 3 is formed by the electron-donating p-type organic semiconductor thin film 4 and electron-accepting n-type organic semiconductor thin film 5 which are alternately stacked. The intermediate layer 8 comprises a p-type organic semiconductor thin film or an n-type organic semiconductor thin film. The p-type organic semiconductor thin film of the intermediate layer 8 has a band gap smaller than p-type organic semiconductor thin film 4. The n-type organic semiconductor thin film of the intermediate layer 8 has a band gap smaller than n-type organic semiconductor thin film 5. The intermediate layer 8 is provided between p-type organic semiconductor thin film 4 and n-type organic semiconductor thin film 5. The thickness of intermediate layer 8 is preferably 1 to 10 nm and more preferably 2 to 4 nm. In this manner, conversion efficiency can be further improved by forming photoelectric conversion layer 3 in the form of a multilayer film obtained by repeatedly laminating a plurality of times three layers consisting of p-type organic semiconductor thin film 4, a low-band-gap organic semiconductor thin film (intermediate layer 8) and n-type organic semiconductor thin film 5.

Figure 6:
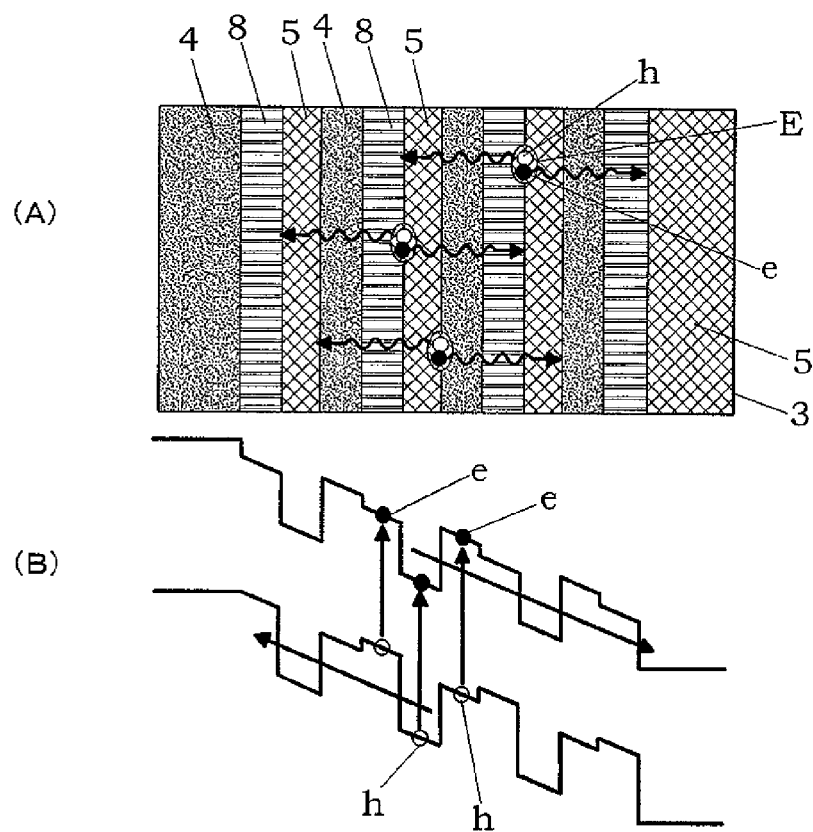

The mechanism of electrical power generation of a solar cell having this photoelectric conversion layer 3 is explained with reference to FIGS. 6A and 6B. Here, intermediate layer 8 is formed by a p-type organic semiconductor thin film having a band gap smaller than p-type organic semiconductor thin film 4. When this solar cell is irradiated with light, in addition to photoabsorption in p-type organic semiconductor thin film 4 and n-type organic semiconductor thin film 5, since light of a long wavelength is absorbed by p-type intermediate layer 8 having a band gap smaller than p-type organic semiconductor thin film 4, light of a broader wavelength range can be absorbed. Next, excitons excited by photoabsorption migrate due diffusion or due to an internal electric field generated by a p-type organic semiconductor thin film and n-type organic semiconductor thin film provided on both sides of photoelectric conversion layer 3, and subsequently undergo charge separation when they reach an interface of p-type organic semiconductor thin film 4 and n-type organic semiconductor thin film 5 or an interface of p-type intermediate layer 8 or n-type organic semiconductor thin film 5, resulting in the generation of electron and hole carriers. Next, if each thin film is sufficiently thin at 10 nm or less, the carriers are transported by penetrating a barrier layer due to tunnel phenomena, enabling them to reach each electrode. Furthermore, although superior carrier transportability is not obtained unless organic semiconductor molecules in which cyclic compounds are bound in a linear fashion is used for p-type organic semiconductor thin film 4, p-type intermediate layer 8 is not limited to organic semiconductor molecules in which cyclic compounds are bound in a linear fashion, but rather metal phthalocyanines, in the form of flat molecules having superior long wavelength photoabsorption, for example, can be used.

In addition, although a p-type organic semiconductor thin film, p-type intermediate layer and n-type organic semiconductor thin film are sequentially stacked in the above example, a low-band-gap p-type organic semiconductor thin film, p-type organic semiconductor thin film and n-type organic semiconductor thin film may also be sequentially stacked. In this case as well, charge separation occurs at the interface of the p-type organic semiconductor thin film and n-type organic semiconductor thin film and at the interface of the low-band-gap p-type organic semiconductor thin film and n-type organic semiconductor thin film, and carriers are transported by tunnel phenomena.

In addition, a low-band-gap n-type organic semiconductor thin film may be employed instead of a low-band-gap p-type organic semiconductor thin film. In this case as well, the operating principle is the same as described above, and higher fullerenes such as C70 or C84 fullerenes, fullerenes having an even larger number of carbon atoms or perylene and the like can be used for the low-band-gap n-type organic semiconductor thin film. In other words, if the band gap is smaller than the n-type organic semiconductor thin film, effects are obtained resulting in an increase in the photoabsorption range as well as an increase in the generated current.

According to the present invention, the source of generated voltage is primarily the potential difference between charge-separated electrons and hole in the form of the difference between the highest occupied molecular orbital (HOMO) level of the p-type organic semiconductor thin film (p-type layer) and the lowest unoccupied molecular orbital (LOMO) level of the n-type organic semiconductor thin film (n-type layer), and since photoabsorption by the p-type layer, n-type layer and intermediate layer (low-band-gap semiconductor layer) greatly contributes to generated current, current and voltage can be independently controlled (improved).

In the case of a compound semiconductor solar cell, an allocated function type of configuration is employed such that the superlattice layer is sandwiched between the p-type layer and n-type layer, light is absorbed with the superlattice layer composed of alternating layers of two types of compound semiconductor layers having different band gaps, and voltage is generated based on a difference in Fermi energy between the p-type layer and n-type layer on both sides thereof. In this case, electron/hole pairs generated as a result of light being absorbed in the superlattice layer are immediately begun to be transported in the form of free carriers, and extremely close values are employed for the band gaps of the two types of alternately stacked semiconductors. In contrast, in the case of the organic thin film solar cell of the present invention, since charge separation is not allowed to occur, interfaces between the p-type layers and n-type layers, and more specifically, a band offset in the form of exciton binding energy of about 0.4 eV or more, is required. A high absorption layer is added thereto to give the solar cell two functions consisting of charge separation and photoabsorption. Moreover, in order to carry out this operation, the p-type layer must be formed using organic semiconductor molecules in which cyclic compounds are bound in a linear fashion, and as a result thereof, a solar cell can be realized having superior carrier transportability.

EXAMPLES

The following provides a detailed explanation of the present invention through examples thereof.

Example 1

As shown in FIG. 4, a hole transport layer 10 in the form of a PEDOT:PSS layer (poly[3,4-(ethylenedioxy)thiophene]:poly (styrene sulfonate) was formed at a film thickness of 30 nm on an electrode 1 in the form of a glass electrode 12 in which an ITO electrode was formed a film thickness of 150 nm. Next, p-type organic semiconductor molecules in the form of pentacene were vacuum vapor-deposited on hole transport layer 10 to form an electron-donating organic semiconductor thin film 6 having a film thickness of 25 nm.

Next, n-type organic semiconductor molecules in the form of fullerene (C60) were vacuum vapor-deposited on thin film 6 to form electron-accepting organic semiconductor thin film 5 having a film thickness of 1 nm, and pentacene was vacuum vapor-deposited thereon to form electron-donating thin film 4 having a film thickness of 1 nm. The fullerene thin film 5 and pentacene thin film 4 were alternately stacked three times each to form a multilayer film in the form of photoelectric conversion layer 3. Thus, this photoelectric conversion layer 3 has a multilayer structure consisting of a total of eight layers provided with four layers each of fullerene thin film 5 having a film thickness of 1 nm and pentacene thin film 4 having a film thickness of 1 nm, and in which these layers are alternately stacked.

Moreover, fullerene was vacuum vapor-deposited on this photoelectric conversion layer 3 to form an electron-accepting thin film 7 having a film thickness of 25 nm. Subsequently, an electron transport layer 11 in the form of bathocuproine (BCP) was formed on thin film 7 at a film thickness of about 5 nm followed finally by forming an electrode 2 in the form of an Ag:Mg alloy thin film at a thickness of 100 nm thereon to obtain an organic thin film solar panel of Example 1.

Example 2

An organic thin film solar panel of Example 2 was obtained in the same manner as Example 1 with the exception of photoelectric conversion layer 3 having a multilayer structure consisting of a total of four layers provided with two layers each of fullerene thin film 5 having a film thickness of 2 nm and pentacene thin film 4 having a film thickness of 2 nm, and in which these layers are alternately stacked.

Example 3

An organic thin film solar panel of Example 3 was obtained in the same manner as Example 1 with the exception of photoelectric conversion layer 3 having a multilayer structure consisting of a total of six layers provided with three layers each of fullerene thin film 5 having a film thickness of 1 nm and pentacene thin film 4 having a film thickness of 2 nm, and in which these layers are alternately stacked.

Comparative Example 1

As shown in FIG. 3, a p-n junction type of photoelectric conversion layer 3, composed of a pentacene layer 20 and a fullerene layer 22, was formed on hole transport layer 10 by forming pentacene layer 20 having a film thickness of 25 nm by vacuum vapor deposition of pentacene and forming fullerene layer 22 having a film thickness of 25 nm by vacuum vapor deposition of fullerene thereon, followed by forming electron transport layer 11 on this photoelectric conversion layer 3. The remainder of the procedure was carried out in the same manner as Example 1 to obtain an organic thin film solar cell of Comparative Example 1.

Comparative Example 2

Figure 7:
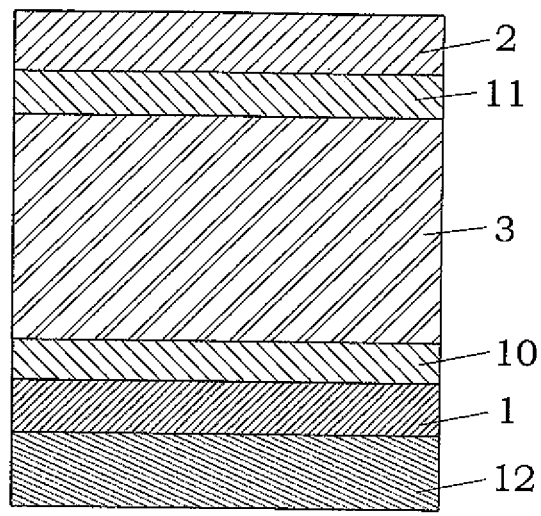
FIG. 7 is a schematic cross-sectional view of an organic thin film solar cell composed of a co-deposited layer of pentacene and fullerene.

As shown in FIG. 7, a photoelectric conversion layer 3, in which pentacene and fullerene were combined by co-deposition at a volume ratio of pentacene to fullerene of 1:1, was formed on hole transport layer 10, and electron transport layer 11 was formed on this photoelectric conversion layer 3. The remainder of the procedure was carried out in the same manner as Example 1 to obtain an organic thin film solar cell of Comparative Example 2.

Solar cell characteristics were measured for each of the organic thin film solar cells obtained in the manner described above by irradiating with simulated sunlight at an AM of 1.5 G and 100 mW/cm$^2$ using a solar simulator. The results of measuring solar cell characteristics are shown in Table 1. Furthermore, the power conversion efficiency (PCE) of the solar cells is represented with the formula below.

PCE(%)=$Jsc$ (short-circuit current)×$Voc$ (open voltage)×FF (fill factor: form factor)/incident energy

TABLE 1

|  | Example 1 | Example 2 | Example 3 | Comparative Example 1 | Comparative Example 2 |
|---|---|---|---|---|---|
| Current voltage (mA/cm$^2$) | 8.4 | 7.9 | 8.8 | 6.6 | 1.7 |
| Open voltage (V) | 0.37 | 0.36 | 0.4 | 0.29 | 0.08 |
| Form factor | 0.43 | 0.46 | 0.42 | 0.48 | 0.24 |
| Power conversion efficiency (%) | 1.34 | 1.32 | 1.48 | 0.93 | 0.03 |

As shown in Comparative Example 1, although photoelectric conversion layer 3 formed by a heterojunction of pentacene and fullerene demonstrates favorable diode characteristics as well as favorable solar cell characteristics when used as a solar cell, since the region in which carriers can be effectively collected from excitons is thought to be limited to only the vicinity of heterojunction interfaces, values are demonstrated that are lower than current values predicted from photoabsorption by pentacene and fullerene. In addition, hardly any output was generated in the case of having formed photoelectric conversion layer 3 by co-deposition in order to increase the number of heterojunction interfaces as in Comparative Example 2. This is because the pentacene is susceptible to aggregation thereby preventing any dispersion with fullerene.

On the other hand, in the organic thin film solar cell of Example 1, in which photoelectric conversion layer 3 is formed by alternately laminating fullerene thin film 5 having a film thickness of 1 nm and pentacene thin film 4 having a film thickness of 1 nm, current values are increased considerably as compared with that of the heterojunction type of Comparative Example 1. This is thought to be because excitons formed in the alternately stacked region undergo efficient charge separation, and carriers are transported by overcoming a potential barrier and extracted to the outside.

In addition, in the forming of photoelectric conversion layer 3 by alternately laminating fullerene thin film 5 and pentacene thin film 4 in this manner, there were hardly any changes in characteristics even if the film thicknesses of thin films 4 and 5 were increased to 2 nm as in Example 2. This indicates that increases in film thickness of this order do not become factors that inhibit overcoming of the potential barrier.

In addition, characteristics were further improved by making the film thickness of pentacene thin film 4 greater than the film thickness of fullerene thin film 5 as in Example 3. This is thought to be because, since pentacene absorbs a larger amount of light and has higher mobility, further improvements are achieved for both photoabsorption and carrier transport.

Example 4

Figure 8:
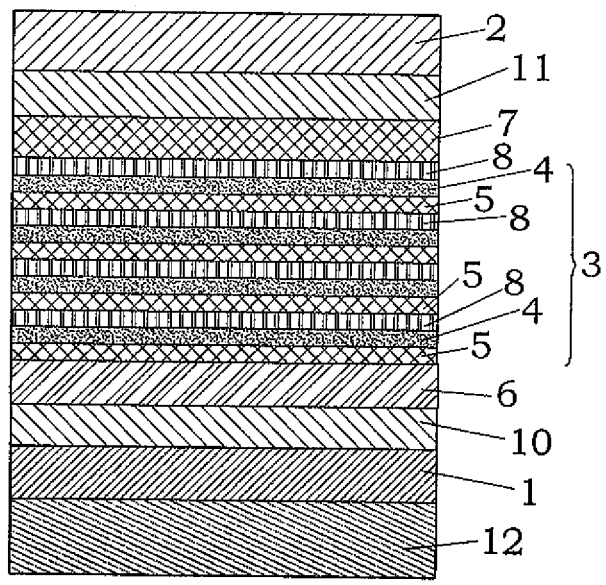
FIG. 8 is a schematic cross-sectional view of an organic thin film solar cell of Example 4; and, FIG. 9 is a schematic cross-sectional view of the organic thin film solar cell of a bulk heterojunction type of the prior art.

As shown in FIG. 8, the organic thin film solar cell of this example is characterized by using pentacene for p-type organic semiconductor thin film 4, fullerene C60 for n-type organic semiconductor thin film 5 and Zn phthalocyanine for low-band-gap p-type organic semiconductor thin film 8, and repeatedly laminating these three layers a plurality of times in the direction of thickness thereof to obtain photoelectric conversion layer 3 having a superlattice structure.

Namely, the overall configuration of this solar cell consists of having sequentially formed transparent electrode 1 in the form of an ITO film and hole transport layer 10 in the form of a PEDOT film on glass substrate 12, followed by forming pentacene layer 6 at a film thickness of 25 nm thereon. Next, C60 fullerene thin film 5 having a film thickness of 2 nm, pentacene thin film 4 having a film thickness of 2 nm and Zn phthalocyanine layer 8 having a film thickness of 2 nm were sequentially formed, and these three layers were repeatedly stacked a total of 4 times to obtain photoelectric conversion layer 3 (having a total of 12 layers). Next, C60 fullerene layer 7 was formed on photoelectric conversion layer 3 at a film thickness of 25 nm, electron transport layer 11 in the form of a BCP layer was formed thereon at a film thickness of 6 nm, and electrode 2 in the form of an AgMg alloy layer was formed on electron transport layer 11 at a film thickness of 60 nm. When the characteristics of the resulting solar cell were evaluated, the output of the solar cell when irradiated with simulated sunlight at an AM of 1.5 G and 100 mW/cm$^2$ using a solar simulator consisted of a short-circuit current of 9.0 mA/cm$^2$, open voltage of 0.37 V, form factor of 0.45 and power conversion efficiency of 1.5%.

In addition, a solar cell having, instead of the photoelectric conversion 3 described above, a photoelectric conversion layer 3 (total of 12 layers) formed by alternately laminating a pentacene thin film 4 having a film thickness of 2 nm and C60 fullerene thin film 5 having a film thickness of 2 nm 6 times, was evaluated in the same manner. In this case, the characteristics of the solar cell consisted of a short-circuit current of 7.9 mA/cm$^2$, open voltage of 0.37 V, form factor of 0.44 and power conversion efficiency of 1.3%. In this manner, the insertion of a light-absorbing layer in the form of a low-band-gap p-type organic semiconductor thin film 8 into a multilayer film obtained by repeatedly laminating a linear p-type organic semiconductor in the form of pentacene and an n-type organic semiconductor in the form of fullerene was found to allow a further increase in generated current to be achieved without causing a decrease in generated voltage.

INDUSTRIAL APPLICABILITY

As is clear from the above-mentioned embodiments, according to the present invention, by forming a photoelectric conversion layer in the form of a multilayer film by alternately laminating an electron-donating organic semiconductor thin film and an electron-accepting organic semiconductor thin film, in addition to being able to obtain photoelectric conversion performance equal to that of a conventional bulk heterojunction layer in which a p-type organic semiconductor (donor) and n-type organic semiconductor (acceptor) are combined and uniformly dispersed in a thin film, as a result of using organic semiconductor molecules in which cyclic compounds are bound in a linear fashion for the electron-donating organic semiconductor thin film, an organic thin film solar cell can be provided having superior carrier transportability to an electrode, and this organic thin film solar cell can be expected to be used practically as a next-generation solar cell to take the place of conventional silicon and compound semiconductor solar cells.

The invention claimed is:

1. An organic thin film solar cell comprising:
a pair of electrodes at least one of which has optical transparency; and
a photoelectric conversion layer arranged between the pair of electrodes, wherein:
the photoelectric conversion layer comprises a multilayer film, in which a three layer structure consisting of a first electron-donating organic semiconductor thin film, an intermediate organic semiconductor layer and a first electron-accepting thin film stacked in this order is repeatedly laminated plural times,
the first electron-donating organic semiconductor thin film is composed of organic semiconductor molecules in which cyclic compounds are bound in a linear fashion,
the first electron-donating organic semiconductor thin film and the first electron-accepting thin film each have a film thickness of 10 nm or less,
the organic semiconductor molecules are an acene-based molecule compound represented by the following formula (1):

$$C_{6+4(n-1)}H_{6+2(n-1)} \tag{1}$$

where n represents an integer of 2 or more,
the multilayer film of the photoelectric conversion layer includes a superlattice structure, and
the intermediate organic semiconductor layer consists of only one kind of an organic semiconductor.

2. The organic thin film solar cell according to claim 1, wherein the first electron-accepting thin film comprises fullerene or a fullerene compound.

3. The organic thin film solar cell according to claim 1, wherein the film thickness of the first electron-donating organic semiconductor thin film is greater than the film thickness of the first electron-accepting thin film.

4. The organic thin film solar cell according to claim 1, wherein
the multilayer film is interposed between a second electron-donating organic semiconductor thin film having a film thickness of 10 nm or more and a second electron-accepting thin film having a film thickness of 10 nm or more.

5. The organic thin film solar cell according to claim 1, wherein:
the intermediate organic semiconductor layer has a thickness of 1 nm to 10 nm, and
the intermediate organic semiconductor layer is a third electron-donating organic semiconductor thin film having a band gap smaller than the first electron-donating organic semiconductor thin film adjacent to the intermediate organic semiconductor layer.

6. The organic thin film solar cell according to claim 1, wherein:
the intermediate organic semiconductor layer has a thickness of 1 nm to 10 nm, and
the intermediate organic semiconductor layer is a third electron-accepting organic semiconductor thin film having a band gap smaller than the first electron-accepting thin film adjacent to the intermediate organic semiconductor layer.

7. The organic thin film solar cell according to claim 3, wherein the film thickness of the first electron-donating organic semiconductor thin film is within a range of 4 times or less the film thickness of the first electron-accepting thin film.

8. The organic thin film solar cell according to claim 4, wherein the second electron-donating organic semiconductor thin film having the film thickness of 100 nm or less and the second electron-accepting thin film having the film thickness of 100 nm or less.

9. The organic thin film solar cell according to claim 5, wherein the thickness of the intermediate organic semiconductor layer is 2 to 4 nm.

10. The organic thin film solar cell according to claim 6, wherein the thickness of the intermediate organic semiconductor layer is 2 to 4 nm.

11. An organic thin film solar cell comprising:
a pair of electrodes at least one of which has optical transparency; and
a photoelectric conversion layer arranged between the pair of electrodes, wherein:
the photoelectric conversion layer comprises a multilayer film formed by a first electron-donating organic semiconductor thin film and a first electron-accepting thin film which are alternately stacked,
the first electron-donating organic semiconductor thin film is composed of organic semiconductor molecules in which cyclic compounds are bound in a linear fashion,
the first electron-donating organic semiconductor thin film and the first electron-accepting thin film each have a film thickness of 10 nm or less,
the organic semiconductor molecules are an acene-based molecule compound represented by the following formula (I):

$$C_{6+4(n-1)}H_{6+2(n-1)} \tag{1}$$

where n represents an integer of 2 or more,
the multilayer film of the photoelectric conversion layer includes a superlattice structure,
the multilayer film further comprises an intermediate organic semiconductor layer provided between the first electron-donating organic semiconductor thin film and the first electron-accepting thin film,
the intermediate organic semiconductor layer has a thickness of 2 nm to 4 nm,
the intermediate organic semiconductor layer is a third electron-donating organic semiconductor thin film having a band gap smaller than the first electron-donating organic semiconductor thin film adjacent to the intermediate organic semiconductor layer.

12. An organic thin film solar cell comprising:
a pair of electrodes at least one of which has optical transparency; and
a photoelectric conversion layer arranged between the pair of electrodes, wherein:
the photoelectric conversion layer comprises a multilayer film formed by a first electron-donating organic semiconductor thin film and a first electron-accepting thin film which are alternately stacked,
the first electron-donating organic semiconductor thin film is composed of organic semiconductor molecules in which cyclic compounds are bound in a linear fashion,
the first electron-donating organic semiconductor thin film and the first electron-accepting thin film each have a film thickness of 10 nm or less,
the organic semiconductor molecules are an acene-based molecule compound represented by the following formula (I):

$$C_{6+4(n-1)}H_{6+2(n-1)} \tag{1}$$

where n represents an integer of 2 or more,
the multilayer film of the photoelectric conversion layer includes a superlattice structure, the multilayer film further comprises an intermediate organic semiconductor layer provided between the first electron-donating organic semiconductor thin film and the first electron-accepting thin film, the intermediate organic semiconductor layer has a thickness of 2 nm to 4 nm, and the intermediate organic semiconductor layer is an electron-accepting organic semiconductor thin film having a band gap smaller than the first electron-accepting thin film adjacent to the intermediate organic semiconductor layer.

\* \* \* \* \*